United States Patent
Allan et al.

(10) Patent No.: US 9,281,829 B2
(45) Date of Patent: Mar. 8, 2016

(54) APPARATUS AND METHODS FOR FAST CHARGE PUMP HOLDOVER ON SIGNAL INTERRUPTION

(71) Applicant: Hittite Microwave Corporation, Chelmsford, MA (US)

(72) Inventors: Gordon John Allan, Ottawa (CA); Justin L. Fortier, Ottawa (CA)

(73) Assignee: Hittite Microwave Corporation, Chelmsford, MA (US)

( * ) Notice: Subject to any disclaimer, the term of this patent is extended or adjusted under 35 U.S.C. 154(b) by 0 days.

(21) Appl. No.: 14/613,271

(22) Filed: Feb. 3, 2015

(65) Prior Publication Data

US 2015/0222280 A1    Aug. 6, 2015

Related U.S. Application Data

(60) Provisional application No. 61/935,669, filed on Feb. 4, 2014.

(51) Int. Cl.

| H03L 7/06 | (2006.01) |
|---|---|
| H03L 7/14 | (2006.01) |
| H03L 7/089 | (2006.01) |
| H03L 7/107 | (2006.01) |
| H03L 7/083 | (2006.01) |
| H03L 7/085 | (2006.01) |
| H03L 7/099 | (2006.01) |

(52) U.S. Cl.
CPC ............... *H03L 7/14* (2013.01); *H03L 7/083* (2013.01); *H03L 7/085* (2013.01); *H03L 7/0891* (2013.01); *H03L 7/099* (2013.01); *H03L 7/1077* (2013.01)

(58) Field of Classification Search
USPC .................. 327/147–149, 156–158
See application file for complete search history.

(56) References Cited

U.S. PATENT DOCUMENTS

| 4,752,748 A * | 6/1988 | Grzeszykowski ...... H03L 7/093 331/1 A |
|---|---|---|
| 5,754,607 A * | 5/1998 | Powell .................... H03L 7/093 327/156 |
| 6,369,624 B1 | 4/2002 | Wang et al. |
| 8,018,289 B1* | 9/2011 | Hu ........................... H03L 7/14 327/20 |
| 2003/0231730 A1 | 12/2003 | Wong et al. |
| 2004/0223575 A1* | 11/2004 | Meltzer ............... H03D 13/003 375/376 |
| 2006/0170471 A1 | 8/2006 | Haerle et al. |
| 2010/0220006 A1* | 9/2010 | Arab ..................... G04R 40/02 342/357.62 |

(Continued)

FOREIGN PATENT DOCUMENTS

WO    WO 2008/084094 A1    7/2008

OTHER PUBLICATIONS

Extended European Search•Report received in European Patent Application No. 15153426.0, dated Jun. 9, 2015, in ten pages.

*Primary Examiner* — Adam Houston
(74) *Attorney, Agent, or Firm* — Knobbe, Martens, Olson & Bear LLP

(57) ABSTRACT

Provided herein are apparatus and methods for fast charge pump holdover on signal interruption. In certain configurations, a clock generator system includes a phase-locked loop (PLL), a fast detect circuit, and a switch electrically coupled to an input of the PLL's loop filter. The fast detect circuit relatively quickly detects when an input signal to the PLL is lost. The fast detect circuit can quickly detect the loss of phase lock and can place the PLL into a holdover such that the frequency of a clock signal generated by the PLL remains within an acceptable range.

21 Claims, 8 Drawing Sheets

(56) References Cited

U.S. PATENT DOCUMENTS

| | | | | |
|---|---|---|---|---|
| 2014/0203842 A1* | 7/2014 | Maruko | ............ | H03K 3/35625 327/12 |
| 2015/0222273 A1* | 8/2015 | Allan | ........................ | H03L 7/08 327/157 |
| 2015/0222280 A1* | 8/2015 | Allan | ...................... | H03L 7/083 327/157 |

\* cited by examiner

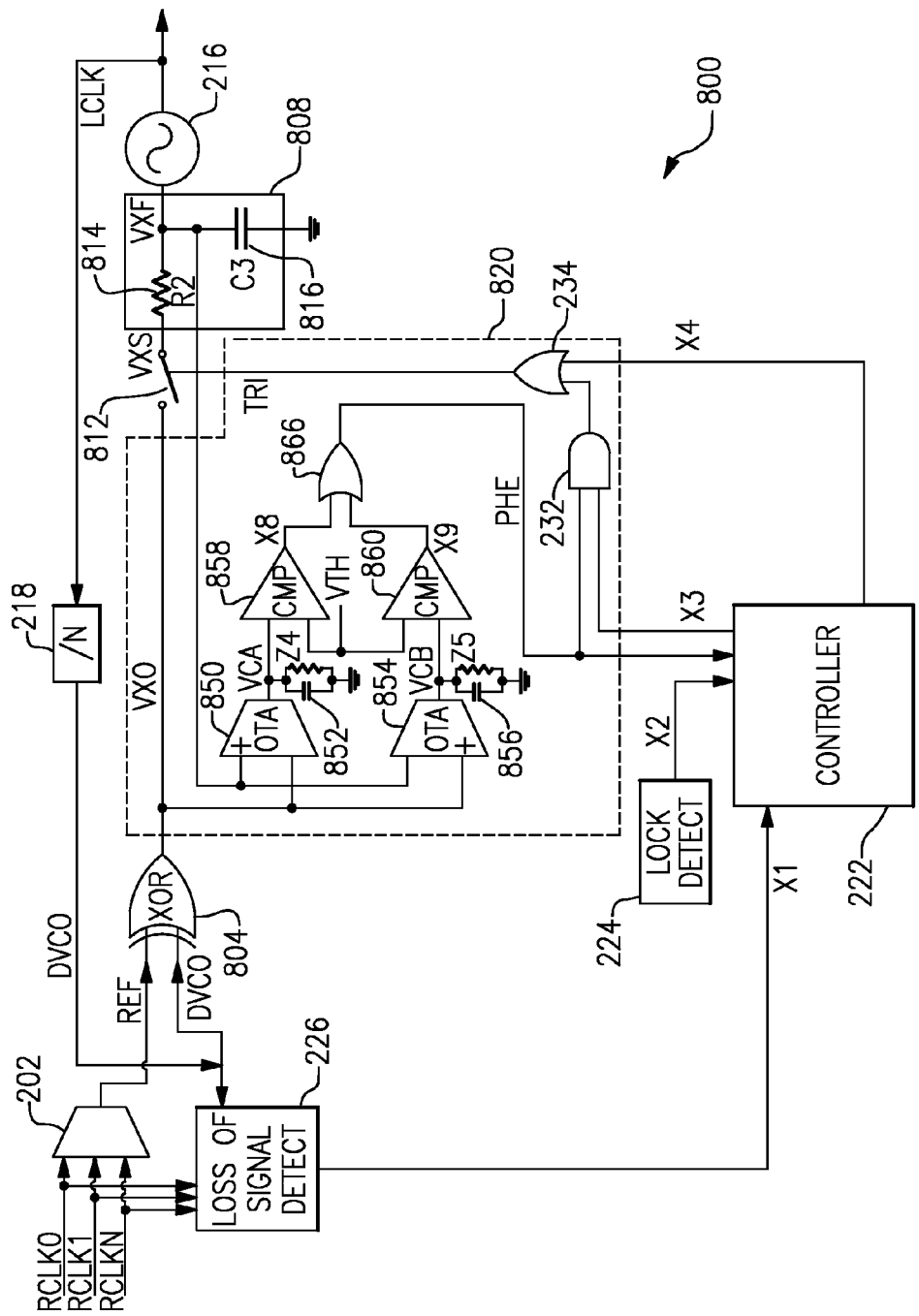

APPARATUS AND METHODS FOR FAST CHARGE PUMP HOLDOVER ON SIGNAL INTERRUPTION

CROSS-REFERENCE TO RELATED APPLICATION

This application claims the benefit under 35 U.S.C. §119 (e) of U.S. Provisional Application No. 61/935,669, filed Feb. 4, 2014, the entirety of which is hereby incorporated by reference.

This application is related to copending applications titled SYSTEM READY IN A CLOCK DISTRIBUTION CHIP, Ser. No. 14/613,123, filed on Feb. 3, 2015, and APPARATUS AND METHODS FOR PHASE-LOCKED LOOPS WITH SOFT TRANSITION FROM HOLDOVER TO REACQUIRING PHASE LOCK, Ser. No. 14/610,025, filed on Jan. 30, 2015, and applications titled SYSTEM READY IN A CLOCK DISTRIBUTION CHIP, Ser. No. 61/935,510, filed Feb. 4, 2014 and JITTER ATTENUATOR CIRCUIT WITH SOFT TRANSITION FROM HOLD-OVER TO RE-ACQUIRING PHASE LOCK, Ser. No. 61/933,971, filed on Jan. 31, 2014, the disclosures of each of which are hereby incorporated by reference in its entirety herein.

BACKGROUND

1. Field

Embodiments of the invention relate to electronic circuits, and more particularly, to clock generator electronic circuits.

2. Description of the Related Technology

Clock generator systems frequently include a phase-locked loop (PLL) to lock a voltage controlled oscillator (VCO) to the phase of an incoming reference clock signal. A high precision tunable crystal oscillator (VCXO) can be phase locked to a relatively noisy reference clock signal.

SUMMARY

One embodiment includes an apparatus, wherein the apparatus includes: a detector circuit configured to determine whether or not an atypical amount of phase error exists in a phase-locked loop or a delay-locked loop; and a holdover circuit configured to enter a holdover state in which a frequency/delay control signal is maintained steady, wherein the holdover state is asynchronously initiated when the detector circuit has determined that the atypical amount of phase error exists.

One embodiment includes a method of initiating a holdover state wherein the method includes determining whether or not an atypical amount of phase error exists in a phase-locked loop or a delay-locked loop; and entering a holdover state in which a frequency/delay control signal is maintained steady, wherein the holdover state is asynchronously initiated when the existence of the atypical amount of phase error has been detected.

One embodiment includes an apparatus, wherein the apparatus includes: a means for determining whether or not an atypical amount of phase error exists in a phase-locked loop or a delay-locked loop; and a means for entering a holdover state in which a frequency/delay control signal is maintained steady, wherein the holdover state is asynchronously initiated when the existence of the atypical amount of phase error has been detected.

One embodiment includes an apparatus, wherein the apparatus includes a detector circuit configured to determine whether or not a phase error greater than a threshold amount exists based on outputs of a phase detector of a phase-locked loop PLL, and a holdover circuit configured to initiate a holdover state in which a control voltage for a voltage-controlled oscillator (VCO) of the PLL is maintained steady, wherein the holdover state is initiated when the detector circuit has determined that the phase error greater than the predetermined threshold amount exists.

BRIEF DESCRIPTION OF THE DRAWINGS

These drawings and the associated description herein are provided to illustrate specific embodiments of the invention and are not intended to be limiting.

FIG. 8 is a schematic diagram of a PLL having a fast detect circuit according to another embodiment.

DETAILED DESCRIPTION OF EMBODIMENTS

Figure 1:
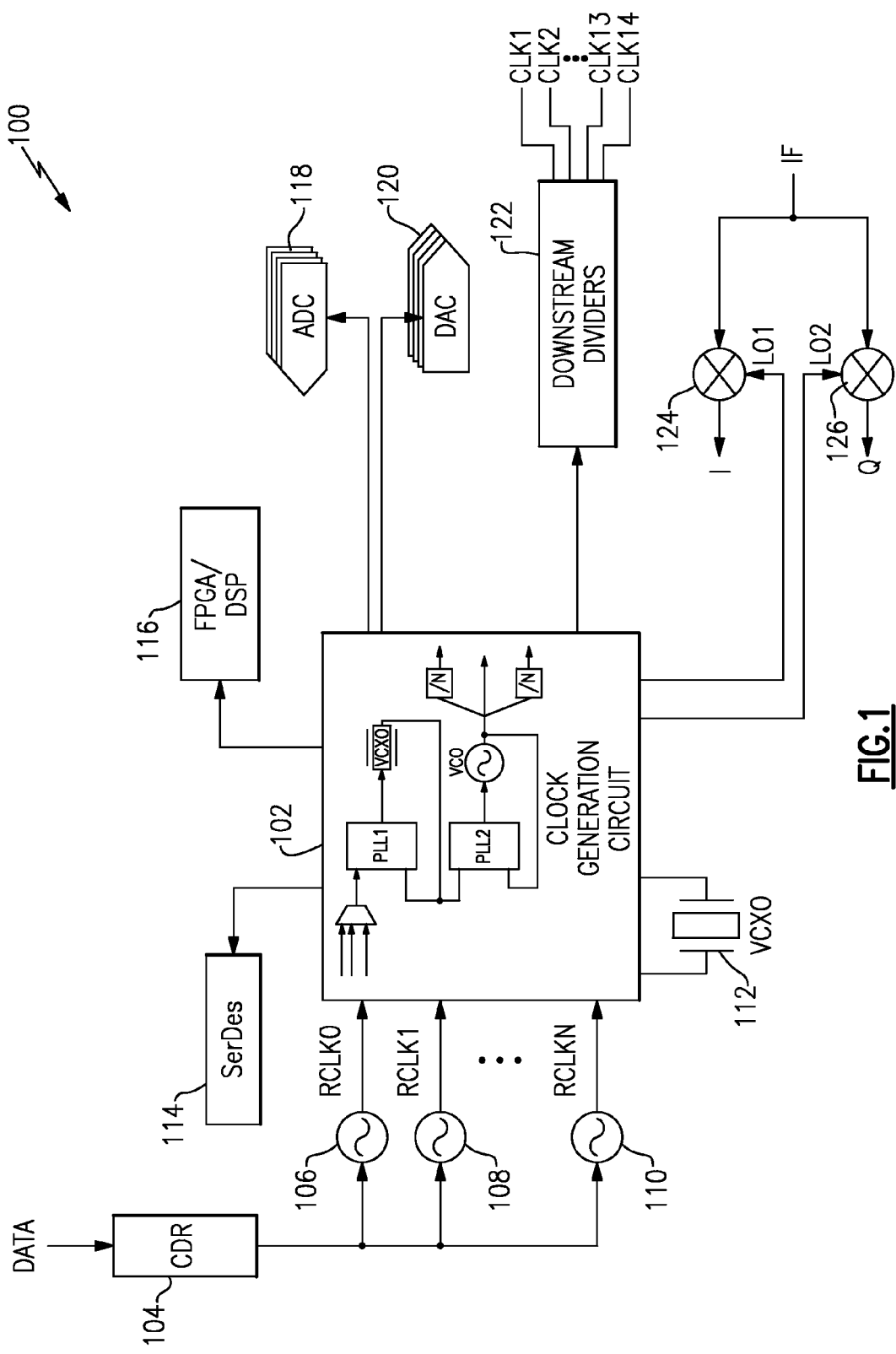
FIG. 1 is a schematic diagram of an example system using a jitter-attenuation and clock generation circuit in accordance with the teachings herein.

The following detailed description of embodiments presents various descriptions of specific embodiments of the invention. However, the invention can be embodied in a multitude of different ways as defined and covered by the claims. In this description, reference is made to the drawings in which like reference numerals may indicate identical or functionally similar elements.

Communication systems operating in a network can require a stable clock reference derived from a noisy data or signal source. For instance, the clock reference can be derived from a data-stream and clock-data recovery circuit. Typically a PLL (phase locked loop) is used to generate a local clock signal by phase locking to an embedded clock signal in a data-stream signal. In cases in which the data-stream signals are intermittent and/or noisy, a holdover circuit can be used to three-state the PLL loop in a manner such that the PLL operates in an open loop configuration and maintains a relatively constant frequency. Three-state can also be known as tri-state. This open-loop condition can also be referred to as holdover. While described in the context of a PLL, the principles and advantages disclosed herein are also applicable to a delay-locked loop (DLL).

In one embodiment, when a circuit is in three-state, the output of the circuit is in a state of high impedance. The high impedance output can effectively open the loop of the PLL at the PLL filter input during periods when the data-stream signal is lost. When the data-stream reference signal is lost, a control circuit can detect the loss and provide a control signal to initiate holdover in an asynchronous manner. This permits the clock signal generated by the PLL to remain relatively stable and permits time for the switching to a substitute reference signal. After the data-stream reference or a substitute reference is detected, a control circuit can change the state of the holdover circuit so the PLL again operates as a closed loop that is locked to the data-stream signal.

In one embodiment, detection circuit can be used to determine the availability of the data-stream reference signal and to determine the need for holdover; upon detecting the loss of the data-stream reference signal, a control signal places the PLL into holdover. In an alternative embodiment, a lock detection circuit can monitor if a relatively large amount of phase error exists and then place the PLL into holdover.

In a conventional system, the time taken to detect the loss of the data-stream reference signal and then to initiate holdover can be relatively large, such as larger than several clock cycles of the PLL. Similarly, the time period to detect the lock condition and then to initiate holdover can also be larger than several clock cycles of the PLL. If the PLL undergoes several clock cycles when a reference clock has become lost, then the PLL output frequency can drift outside a specified frequency range.

Accordingly, limitations of the detection circuitry response time with respect to several clock cycles of the PLL can cause error in the PLL output signal at the onset of holdover. Moreover, such errors can be unacceptable for certain applications and/or clocking systems under strict timing constraints. For instance, frequency perturbations, due to the error, can cause overflow or underflow of memory buffers.

Described herein are apparatus and methods that quickly detect signal interruption such that a charge pump of a PLL can be three-stated or placed in high impedance so that the frequency control voltage to the VCO of the PLL or delay control signal to delay lines of a DLL is held relatively steady. The fast charge pump three-state circuit can include a fast detect circuit connected to the PLL loop to monitor a plurality of signals so that the loss of the data-stream reference signal can be detected relatively quickly, such as, but not limited to, within few gate delays, typically nanoseconds, of its occurrence.

FIG. 1 is a schematic diagram of a communication system 100 with a clock generation circuit 102. The communication system 100 shows a representative clock generation circuit 102 receives a plurality of input clock signals RCLK0, RCLK1, and RCLKN. The number of input clock signals can be two or more and can vary in a very broad range. The plurality of input clock signals RCLK0, RCLK1, and RCLKN can be derived from one or more clock and data recovery (CDR) circuits 104. The CDR circuits 104 can be for high-speed networks such as optical networks. Examples of such networks include, but are not limited to, Sonet and SDH. The plurality of input clock signals RCLK0, RLCK1, and RCLKN are symbolically represented as outputs of a first generator 106, a second generator 108, and a third generator 110, respectively. The clock generation circuit 102 can phase lock an output of a tunable oscillator VCXO 112 to a selected one of the input clock signals RCLK0, RCLK1, and RCLKN, which is referred to herein as the primary reference clock signal. The other input clock signals can serve as backup input clock signals should the selected clock signal become invalid, such as by becoming unavailable. In one embodiment, the tunable oscillator VCXO 112 corresponds to a high precision tunable crystal oscillator.

The clock generation circuit 102 can use this clean and locked VCXO as the basis for further clock-multiplication to provide and distribute relatively stable high-frequency low-jitter clock signals as clock outputs to other elements of the communication system 100, which can include, for example, one or more of the following: a serializer/deserializer (SER-DES) block 114, a digital signal processor (DSP) 116, an analog to digital converter ADC 118, a digital-to-analog converter 120, a series of downstream dividers 122, an IQ-demodulator showing I multiplier 124 and a Q multiplier 126. Additional downstream clocks CLK1, CLK2, through CLK14 can be derived from a clock signal output of the clock generation circuit 102 by division; and the I multiplier 124 and the Q multiplier 126 can represent in-phase (I) and quadrature-phase (Q) signals demodulated using clock signals from the clock generation circuit 102.

The elements of the communication system shown in FIG. 1 should use stable signals; however, the plurality of input clock signals RCLK0, RCLK1, and RCLKN can be relatively noisy and can suffer from intermittent disconnections or discontinuities. For example, a cable carrying a particular signal used to generate an input clock signal can be unplugged or a piece of hardware involved with transmitting or processing the signal can fail. The clock generation circuit 102 can include a relatively low loop bandwidth PLL to phase lock a tunable oscillator (such as a high precision tunable crystal oscillator or VCXO) 112, to one of these references. The tunable oscillator VCXO 112 can be a voltage-controlled oscillator (VCO). When the loop bandwidth is low, the phase noise of the reference clock signal is suppressed, and the output phase noise can be about that of the tunable oscillator VCXO 112 such that the low loop bandwidth PLL serves as a jitter attenuator providing a clean local reference clock for a $2^{nd}$ stage, low noise wide band PLL.

When the primary reference clock signal RCLK0 is recognized as invalid, a fast detect circuit within the clock generation circuit 102 provides control signals to quickly place the low loop bandwidth PLL into a holdover state, which can be a high-impedance open-loop condition. In one embodiment, the criterion for fast detection is the detection of the loss of primary reference clock signal before the low loop bandwidth PLL has completed relatively many clock cycles. In certain embodiments, the fast detection occurs within a clock cycle, such as within several nanoseconds. In this way, a tuning voltage at a control input of the tunable oscillator 112 can be held at a previous value, which controls the frequency of the output signal of the tunable oscillator VCXO 112 to some value close to the original frequency before the discontinuity occurs.

Figure 2:
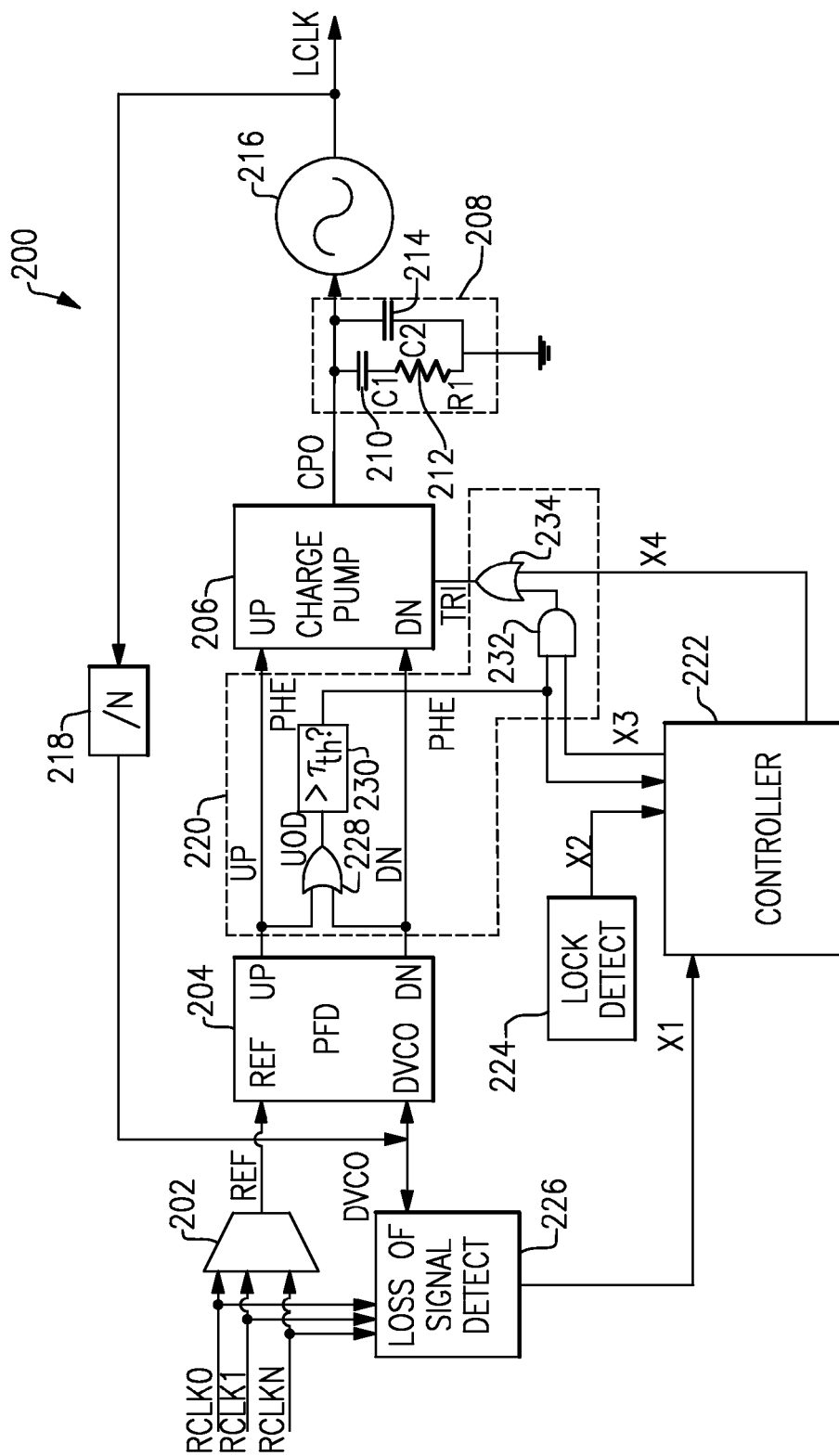
FIG. 2 is a schematic diagram of a PLL having a fast detect circuit according to one embodiment.

FIG. 2 is a schematic diagram of a PLL 200 having a fast detect circuit 220 according to one embodiment. With reference to the discussion of the embodiment of FIG. 1, the PLL 200 can be a low loop bandwidth PLL designed as a jitter attenuator. The PLL 200 includes a multiplexer (mux) 202 which can receive a plurality of input clock signals RCLK0, RCLK1, and RCLKN and can select from the plurality of input clock signals RCLK0, RCLK1, and RCLKN, a reference signal REF as an output. The PLL 200 further includes a voltage controlled oscillator (VCO) 216, which can be the tunable oscillator VCXO 112 (FIG. 1), to provide an output clock signal LCLK, which can be a local clock signal of a jitter attenuator. A divider circuit 218 can receive the output clock signal LCLK and can generate a divided output clock signal DVCO having a lower frequency than that of the output clock signal LCLK. In this way the frequency of the output clock signal LCLK can be programmable by some division number N of the divider circuit 218, which effectively increases the frequency of the output clock signal LCLK by N. In some alternative embodiments, there can be another divider circuit between the multiplexer 202 and a phase frequency detector (PFD) 204 to divide down the output clock signal LCLK. In some embodiments, the divider circuit 218 can be optional or not present.

The phase frequency detector (PFD) 204 compares the divided output clock signal DVCO with the reference signal REF. The phase frequency detector 204 detects the phase of the divided output clock signal DVCO relative to the reference signal REF. The phase frequency detector 204 provides a pump up signal UP and a pump down signal DN to a charge pump 206 which can source or sink current at an output node of the charge pump 206. The output node of the charge pump 206 is electrically connected to an input node of a loop filter 208 where a filter input voltage CPO is established. In the illustrated embodiment, the loop filter 208a has a first capacitor C1 210, a first resistor R1 212, and a second capacitor C2 214 connected as a passive proportional integral (PI) loop filter. For this case, the voltage at the input of the voltage control oscillator 216, referred to as the tuning port voltage, corresponds to the filter input voltage CPO and controls the frequency of the output clock signal LCLK of the VCO 216.

The PLL 200 further includes circuitry to monitor the plurality of input clock signals RCLK0, RCLK1, and RCLKN so as to determine when the reference signal REF becomes invalid. A loss of signal detect circuit 226 can monitor the plurality of input clock signals RCLK0, RCLK1, and RCLKN to provide a reference interrupt signal X1 indicating the presence or absence of one or more of the plurality of input clock signals RCLK0, RCLK1, and RCLKN. A lock detect circuit 224 can monitor if the PLL 200 is in phase lock and provide a lock control signal X2 indicating when the PLL 200 has lost phase lock. However, the reference interrupt signal X1 and the lock control signal X2 can be relatively slow to respond to changes in conditions. For example, the loss of detect circuit 226 can compare selected input clock signals to each other to determine whether one is lost. This process can take a few clock cycles of the input clock signals. Depending on the division by the divider circuit 218, the reference interrupt signal X1 and the lock control signal X2 may take more than 20 clock cycles of the output clock signal LCLK before changing state. Within that long a period of time, the PLL 200, can become locked to an invalid signal or undesirably drift to an undesirable frequency, and by the time the PLL 200 enters holdover, the PLL 200 can have an output clock signal LCLK with a frequency that is out of specification. Advantageously, the PLL 200 further includes the fast detect circuit 220 to provide a holdover control signal TRI having desirably fast characteristics to engage holdover before the PLL 200 has a chance to drift appreciably. In the illustrated embodiment, when the fast detect circuit 220 detects a relatively large phase error at the outputs of the PFD 204, the fast detect circuit 220 advantageously asynchronously initiates the holdover state for the charge pump 206. The holdover state can be maintained based on a known state of the system. For example, when it is known that a reference signal is not present via the loss of signal detect circuit 226 and the reference interrupt signal X1, the controller 222 can maintain the holdover state.

The fast detect circuit 220 of FIG. 2 can analyze the pump up signal UP with the pump down signal DN to determine when the PLL 200 transitions exhibit atypical amounts of phase error that are inconsistent with the locked condition. If the PLL 200 is locked, and this large-error condition is sensed, it is an early indication of a failed reference, and the circuit takes early action to tri-state or open circuit the charge-pump (holdover state). The illustrated fast detect circuit 220 is implemented with a first OR gate 228 and a logic time detection circuit 230. However, various alternative circuits exist. The pump up signal UP is received at a first input node of the first OR gate 228, while the pump down signal DN is received at a second input node of the first OR gate 228. The logical OR operation of the pump up signal UP and the pump down signal DN can provide a trigger pulse signal UOD as an input to a logic time detection circuit 230. One embodiment of the logic time detection circuit 230 is described in further detail later in connection with FIG. 3. Waveforms illustrating the operation of the fast detect circuit 220 appear in FIGS. 4 and 5.

The logic time detection circuit 230 can logically compare a timing characteristic, such as a pulse width, of the trigger pulse signal UOD relative to a threshold time delay $\tau_{th}$ and generate a logic comparator output signal PHE. When the PLL 200 is in phase lock with relatively low phase error, the timing characteristic of the trigger pulse signal UOD will exhibit a pattern relative to the threshold time delay $\tau_{th}$, and the logic comparator output signal PHE will remain in one state, such as a logic low state as described later in connection with FIG. 4. However, when the reference signal REF becomes invalid, the timing characteristic, such as a pulse width, of the trigger pulse signal UOD changes relatively quickly; this in turn can cause the logic comparator output signal PHE to transition logic states. The transition of the logic comparator output signal PHE can be triggered relatively quickly, such as, within a few gate delays, compared to the period of a clock cycle of the output clock signal LCLK.

The fast detect circuit 220 also includes a first AND gate 232 which can perform a logical AND of the logic comparator output signal PHE with a first enable signal X3. Additionally, the fast detect circuit 220 includes a second OR gate 234 which provides a holdover control signal TRI to the charge pump 206. The second OR gate 234 can perform a logical OR operation of an output of the first AND gate 232 and a forcing signal X4, which can be used to maintain the tri-state or holdover condition after it has been triggered.

The fast detect circuit 220 of FIG. 2 activates the holdover control signal TRI to the charge pump 206. The holdover control signal can in turn effectively open circuit the output of the charge pump 206 and place the PLL 200 into holdover. It will be understood that an open circuit can include a relatively high resistance state. As shown in FIG. 2, the holdover control signal TRI depends upon the logic comparator output signal PHE and upon a first enable signal X3 and a forcing signal X4. The first enable signal X3 is used to disable the fast detect circuit 220 during a startup period when the PLL 200 is acquiring phase lock. A controller 222 can provide a logic low on the first enable signal X3 and a logic high on the second enable signal X4 based upon states of the PLL 200. For instance, after the PLL 200 acquires phase lock, then the fast detect circuit 220 can be enabled by providing a logic high on the first enable signal X3 and a logic low on the forcing signal X4.

In addition, when the fast detect circuit 220 indicates a transition from phase lock to not having phase lock, this will eventually be recognized by the controller 222, which can assert the forcing signal X4 to force the second OR gate 234 to maintain holdover for a relatively long period of time and can operate as a latch to maintain the holdover state. For example, the controller 222 can optionally include a flip flop or a latch that is set by the logic comparator output signal PHE and is used to generate the forcing signal X4. The controller 222 can be embodied by software/firmware instructions executed by a processor, by hardware, or by a combination of software/firmware and hardware.

For instance, upon determining that a clock signal selected from the other of the plurality of input clock signals RCLK0, RCLK1, and RLCKN can be used to provide and to renew the reference signal REF, then the controller 222 can remove the first enable signal X3 and the forcing signal X4 so as to remove the system from holdover and allow re-acquisition.

Once the PLL 200 reacquires phase lock with the new reference signal REF, the controller 222 can then re-enables the fast detect circuit 220 by asserting enable signal X3. In this way, the fast detect circuit 220 can again transition from phase lock to holdover quickly based upon the pump up signal UP and the pump down signal DN.

The controller 222 can control the first enable signal X3 and the forcing signal X4 based upon additional information. For instance, the controller 222, as shown in FIG. 2, can receive the reference interrupt signal X1, the lock detect signal X2, and the logic comparator output signal PHE to determine appropriate states for the first enable signal X3 and the forcing signal X4.

Figure 3:
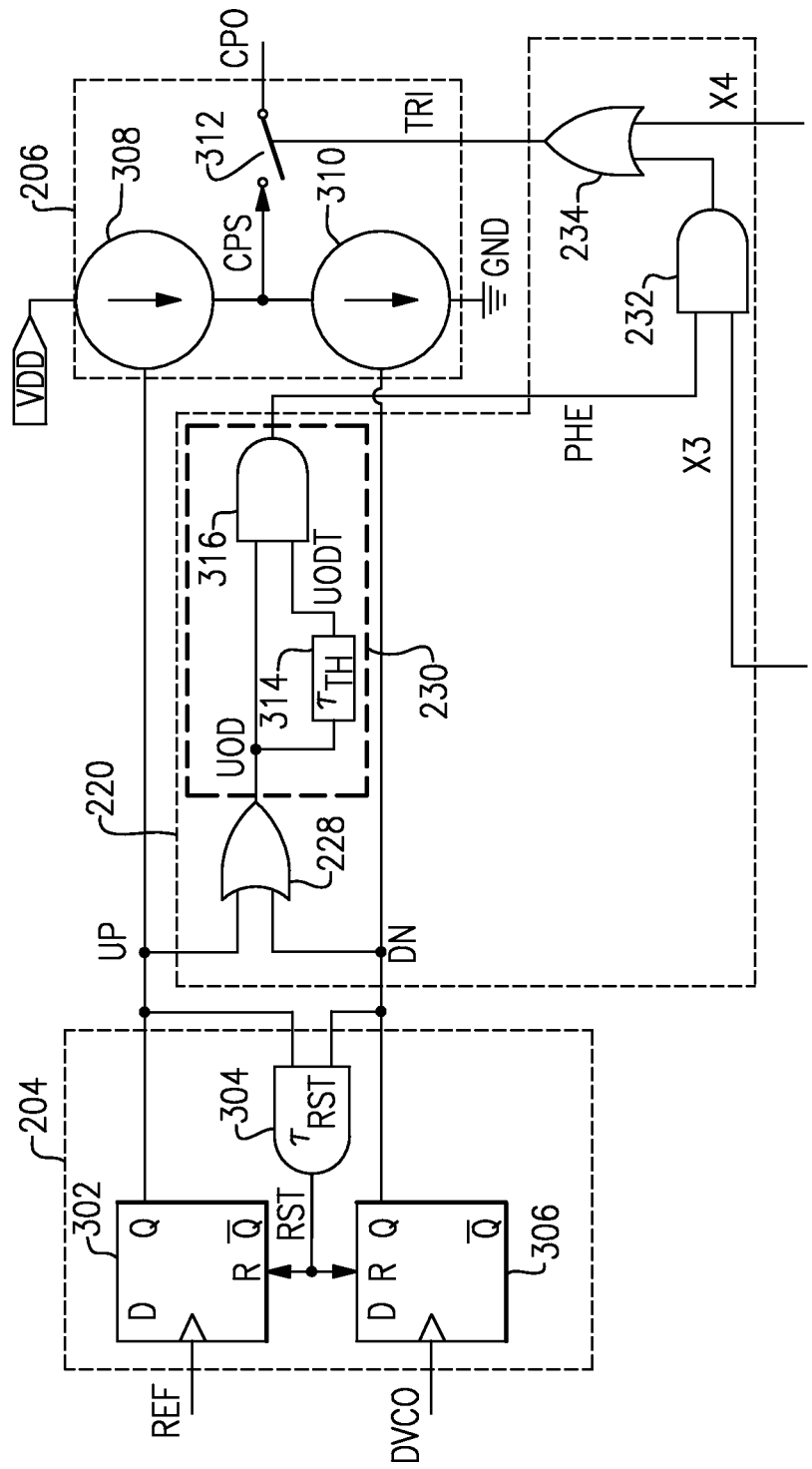
FIG. 3 is a schematic diagram showing the connections of the fast detect circuit in a PLL according to one embodiment.

FIG. 3 is a schematic diagram showing the connections of the fast detect circuit 220 in a PLL according to one embodiment. FIG. 3 also shows further details of one embodiment of the phase frequency detector 204, the logic time detection circuit 230, and the charge pump 206. The phase frequency detector 204 can include a first D-type flip-flop 302 clocked by the reference signal REF and by a second D flip-flop 306 clocked by the divided output clock signal DVCO. A reset AND gate 304 having a reset time delay $\tau_{rst}$ receives the pump up signal UP and the pump down signal DN and provides a reset signal RST to the first D flip-flop 302 and to the second D flip-flop 306.

FIG. 3 also shows further details of the charge pump 206. In the illustrated embodiment, the charge pump 206 includes a high side current source 308, which sources current to a node CPS when the pump up signal UP is a logic high and a low side current source 310, which sinks current from the node CPS when the pump down signal DN is a logic high. A first node of the low side current source 310 can be electrically connected to ground, and a first node of the high side current source 308 can be electrically connected to supply (VDD). Also, a first switch 312 is electrically connected between the output node of the charge pump 206 and a common node electrically connecting a second node of the low side current source 310 with a second node of the high side current source 308. The first switch 312 further receives the three-state control signal TRI which can control the switch to be electrically opened or closed. For instance, when the holdover control signal TRI is a logic high, then the first switch 312 can be opened to place the PLL into holdover.

FIG. 3 additionally shows an example of a logic circuit realization for the logic time detection circuit 230 including a first delay block 314 and a third AND gate 316. The trigger pulse signal UOD is provided from the first OR gate 228 to an input of the first delay block 314 and to a first input of the third AND gate 316. The first delay block 314 provides a delayed pulse signal UODT having the same waveform as the trigger pulse signal UOD but delayed by the threshold delay time $\tau_{th}$. The delayed pulse signal UODT is provided to a second input of the third AND gate 316.

Figure 4:
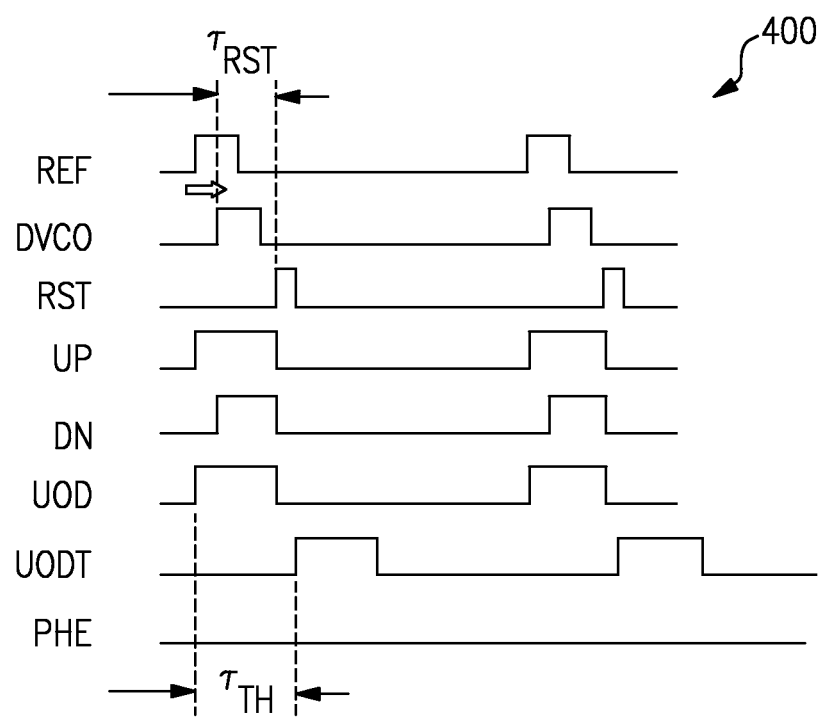
FIG. 4 is a timing diagram for one condition corresponding to an embodiment.

FIG. 4 is a timing diagram for one condition corresponding to an embodiment. The timing diagram can correspond to the embodiment of FIG. 3 within the PLL 200 of FIG. 2. In this embodiment, the PLL 200 is in phase lock with relatively small phase error between the reference signal REF and the divided output clock signal DVCO. The timing diagram shows the reference signal REF, the divided output clock signal DVCO, the reset signal RST, the pump up signal UP, the pump down signal DN, the trigger pulse signal UOD, the delayed pulse signal UODT, and the logic comparator output signal PHE. The principles of phase lock in a PLL having a phase frequency detector 204 and a charge pump 206 are well established and should be understood among those practiced in the art of PLLs.

When the PLL 200 is in phase lock, the closed feedback loop adjusts the filter input voltage CPO to change the frequency of the VCO 216 (FIG. 2). The waveforms of FIG. 4 are consistent with phase lock, and the phase frequency detector 204 of FIG. 3 provides delay in the amount of the reset time delay $\tau_{rst}$ while the first delay block 314 provides delay in the amount of the threshold time delay $\tau_{th}$. The reference signal REF and the divided output clock signal DVCO arrive at the phase frequency detector 204 with relatively low phase error. In the example of FIG. 4, the rising edge of the reference signal REF arrives earlier than the rising edge of the divided clock signal DVCO, and the rising edge of the reference signal REF asserts the pump up signal UP to increase the filter input voltage CPO which increases the frequency of the output clock signal LCLK. The rising edge of the divided output clock signal DVCO then arrives and via the reset AND gate 304, and resets the flip flops 302, 306. As per theory and practice of PLL design, the amount of charge added and subtracted at the input node of the loop filter during phase lock sums to zero; and the PLL 200 maintains the waveforms of the pump up signal UP and the pump down signal DN so as to keep the filter input voltage CPO constant or for a DLL, the selected tap of the delay line constant. When the PLL 200 operates in phase lock, the reference signal REF and the divided output clock signal DVCO arrive at the phase frequency detector 204 approximately at the same time and the pump up signal UP and the pump down signal DN can be approximately equal in width and coincident in time.

As discussed earlier with respect to FIG. 2 and FIG. 3, the behavior of the trigger pulse signal UOD depends upon the timing of the trigger pulse signal UOD and the delayed pulse signal UODT. The behavior of the logic comparator output signal PHE depends upon the logical AND of the trigger pulse signal UOD and the delayed pulse signal UODT. When the first delay block 314 is configured such that the threshold time delay $\tau_{th}$ is larger than the reset time delay $\tau_{rst}$, then the trigger pulse signal UOD and the delayed pulse signal UODT do not overlap when the PLL 200 is phase locked and has a relatively small amount of phase error. When the trigger pulse signal UOD and the delayed pulse signal UODT do not overlap, the logic comparator output signal PHE does not change state and remains at a logic low while the PLL 200 operates in phase lock. Accordingly, no holdover of the PLL 200 occurs.

While the PLL 200 operates in phase lock, the reference signal REF and the divided output clock signal DVCO are nearly coincident and have about the same pulse width. The reference signal REF transitions from low to high first, there is a small delay and the divided output clock signal DVCO transitions from low to high. At this point, both the reference signal REF and the divided output clock signal DVCO are high.

Also as shown in FIG. 4, the pump up signal UP transitions from low to high nearly coincident with the transition of the reference signal REF; while the pump down signal transitions from low to high nearly coincident with the transition of the divided output clock signal DVCO. In response to the logical AND function of both the pump up signal UP and the pump down signal DN, the reset AND gate 304 provides the reset signal RST pulse, which has a delay shown as the reset time delay $\tau_{rst}$. Therefore, an initial timing mark for the reset time delay $\tau_{rst}$ is delineated at the transition point where both the pump up signal UP and the pump down signal DN are simultaneously a logic high. The final timing mark is delineated at the rising edge of the reset signal RST. The logic high of the reset signal RST resets the pump up signal UP and the pump down signal DN to a logic low.

The trigger pulse signal UOD transitions from low to high coincident with the transition of the first transition of either the pump up signal UP or the pump down signal DN. In this case, the low to high transition of the trigger pulse signal UOD is coincident with the low to high transition of the pump up signal UP. This delineates the initial timing mark for the threshold time delay $\tau_{th}$. The delayed pulse signal UODT is delayed by the first delay block 314 an amount equal to the threshold time delay $\tau_{th}$, and the low to high transition of the delayed pulse signal UODT delineates the threshold time delay $\tau_{th}$.

Because both the delayed pulse signal UODT and the trigger pulse signal UOD are not simultaneously a logic high as shown in FIG. 4, the logic comparator output signal PHE, provided by the third AND gate 316, does not transition to a logic high. The logic comparator output signal PHE stays in a logic low state because both the pump up signal UP and the pump down signal DN transition from high to low before the delayed pulse signal UODT makes a transition from low to high. Therefore, by keeping the reset time delay $\tau_{rst}$ less than the threshold time delay $\tau_{th}$, the fast detect circuit 220 faithfully keeps the logic comparator output signal PHE at a logic low when the PLL 200 operates in phase lock.

Furthermore, while FIG. 4 shows one example of the timing diagrams for the PLL 200 operating in phase lock, other configurations and modes of operation are possible. For instance the reference signal REF could transition from low to high before the divided output clock signal DVCO transitions from low to high. As long as the PLL 200 operates in phase lock, the logic comparator output signal PHE should not change state when the reset time delay $\tau_{rst}$ is configured to be less than the threshold time delay $\tau_{th}$.

Figure 5:
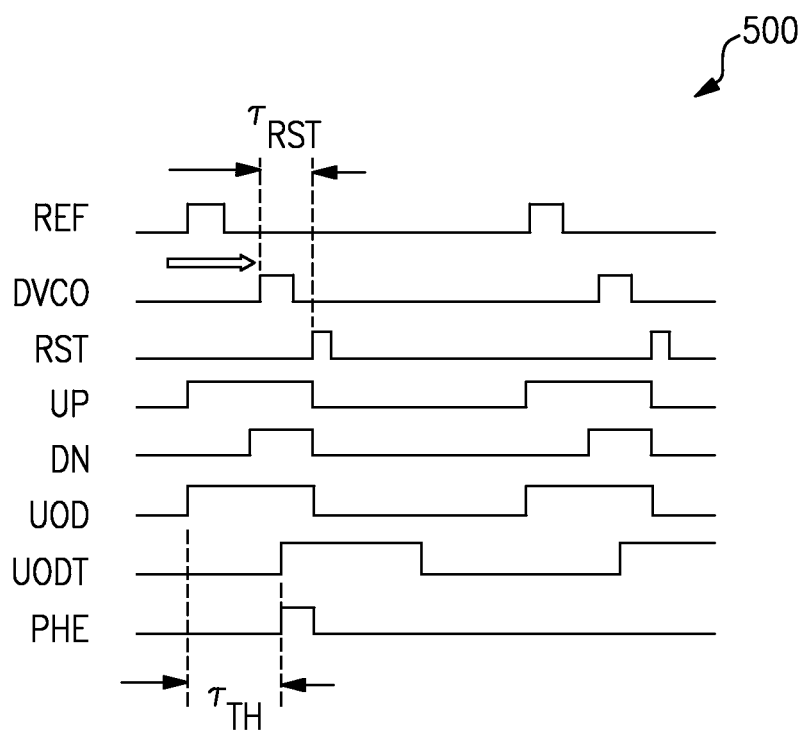
FIG. 5 is a timing diagram for another condition corresponding to an embodiment.

FIG. 5 is a timing diagram for another condition corresponding to an embodiment. The timing diagram can correspond to the embodiment of FIG. 3 within the PLL 200 of FIG. 2. In this example, the PLL 200 is either out of lock, or has suffered a disturbance and a relatively large phase error exists. In this case the timing waveforms show the logic comparator output signal PHE does change state.

When a PLL 200 loses one of its signals, the phase error can become relatively large nearly instantaneously. A relatively large misalignment can effect an undesirable change in the filter input voltage CPO. In the timing diagram of FIG. 5, the reference signal REF transitions from low to high first; then there is a large delay before the divided output clock signal DVCO transitions from low to high. This in turn causes the pump up signal UP and the pump down signal DN to have a relatively large difference in pulse widths. The pump up signal UP transitions from low to high coincident with the rising edge of the reference signal REF. The trigger pulse signal UOD is also coincident with the rising edge of the pump up signal UP. As per the discussion of FIG. 4, this also delineates the initial timing mark of the threshold time delay $\tau_{th}$, while the rising edge of the delayed pulse signal UODT delineates the final timing mark of the threshold time delay $\tau_{th}$.

Also as per the discussion with regard to FIG. 4, the transition where both the pump up signal UP and the pump down signal DN are a logic high delineates the initial timing mark of the reset time delay $\sigma_{rst}$, while the rising edge of the reset signal RST delineates the final timing mark of the reset time delay $\tau_{rst}$.

As per the timing diagram of FIG. 5, the relatively large misalignment of the reference signal REF and the divided output clock signal DVCO leads to a condition where the trigger pulse signal UOD and the delayed pulse signal UODT can be a logic high simultaneously. The time period of overlap where both the trigger pulse signal UOD and the delayed pulse signal UODT are a logic high gives rise to a pulse waveform in the logic comparator output signal PHE. Therefore, during the case where the PLL 200 is out of phase lock and/or has a relatively large phase error, the fast detect circuit 220 can detect the out of phase lock condition and can cause the logic comparator output signal PHE to change logic states. The logic comparator output signal PHE can, in turn, cause the holdover control signal TRI to control the first switch 312 to open.

The fast detect circuit 220 can advantageously cause the first switch 312 to open within a relatively short period of time. In the illustrated embodiment, this relatively short period of time is determined by mere gate delay. For instance, the gate delay can be on the order of a few nanoseconds. Thus, in the illustrated embodiment, the fast detect circuit 220 can effect holdover in the PLL 200 within a few nanoseconds. The holdover state can be maintained via a logic high from the second enable signal X4 from the controller 222.

Figure 6:
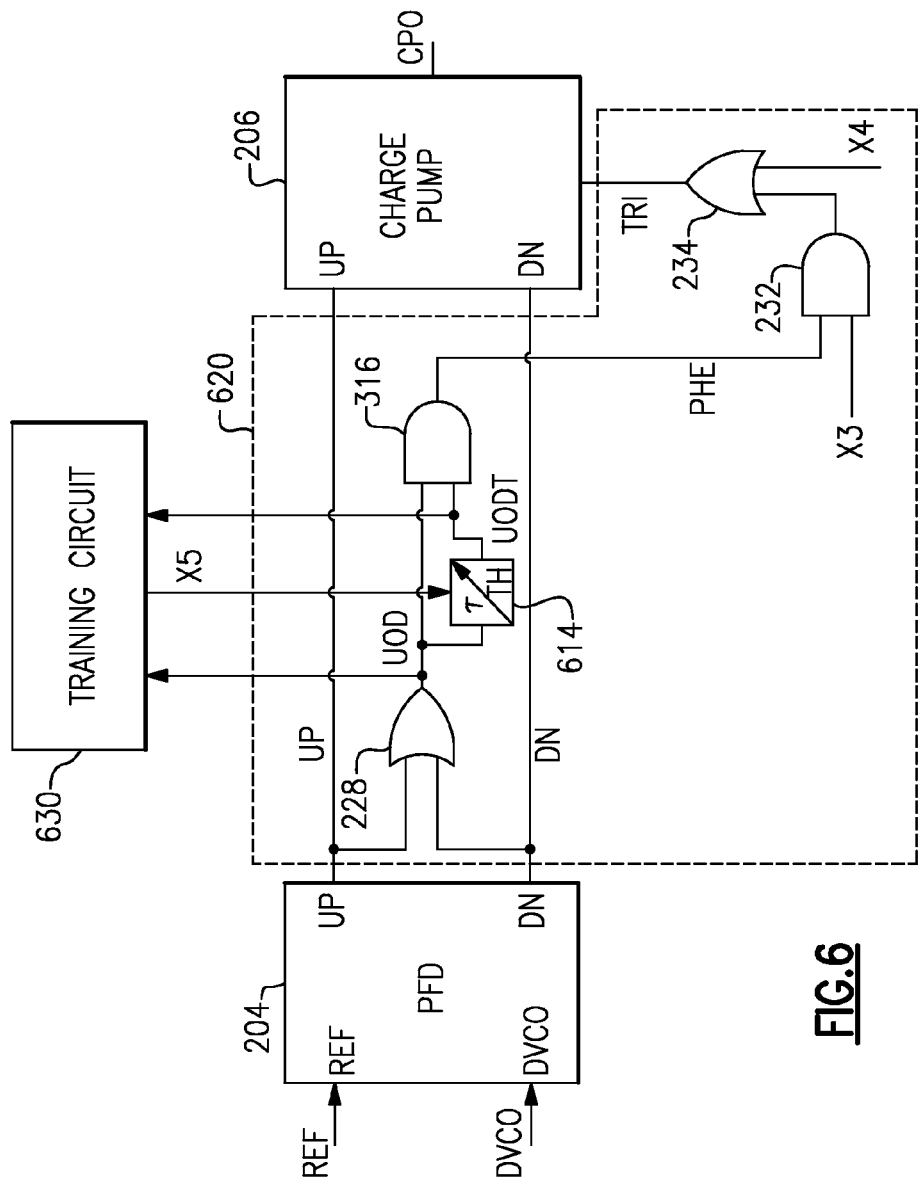
FIG. 6 is a schematic diagram showing the connections of a fast detect circuit and a training circuit in a PLL according to one embodiment.

FIG. 6 is a schematic diagram showing the connections of a fast detect circuit 620 and a training circuit 630 in a PLL according to one embodiment. The fast detect circuit 620 of FIG. 6 can be similar to the embodiment of FIG. 3 except the first delay block 314 is replaced by a variable delay block 614. The variable delay block 614 can be controlled by the training circuit 630 to program the value of the threshold time delay $\tau_{th}$ using a threshold delay control signal X5. The training circuit 630 can receive the trigger pulse signal UOD and the delayed pulse signal UODT and calculate a value for the threshold time delay $\tau_{th}$ so that it meets the criteria for causing the logic comparator output signal PHE to transition only when the PLL transitions out of phase lock. The combination of the training circuit 630 with the variable delay block 614 thereby offers an additional degree of freedom and can be used to compensate for large-phase errors at the input caused by excessive reference noise, gapped clocks, delta-sigma modulation, etc.

Figure 7:
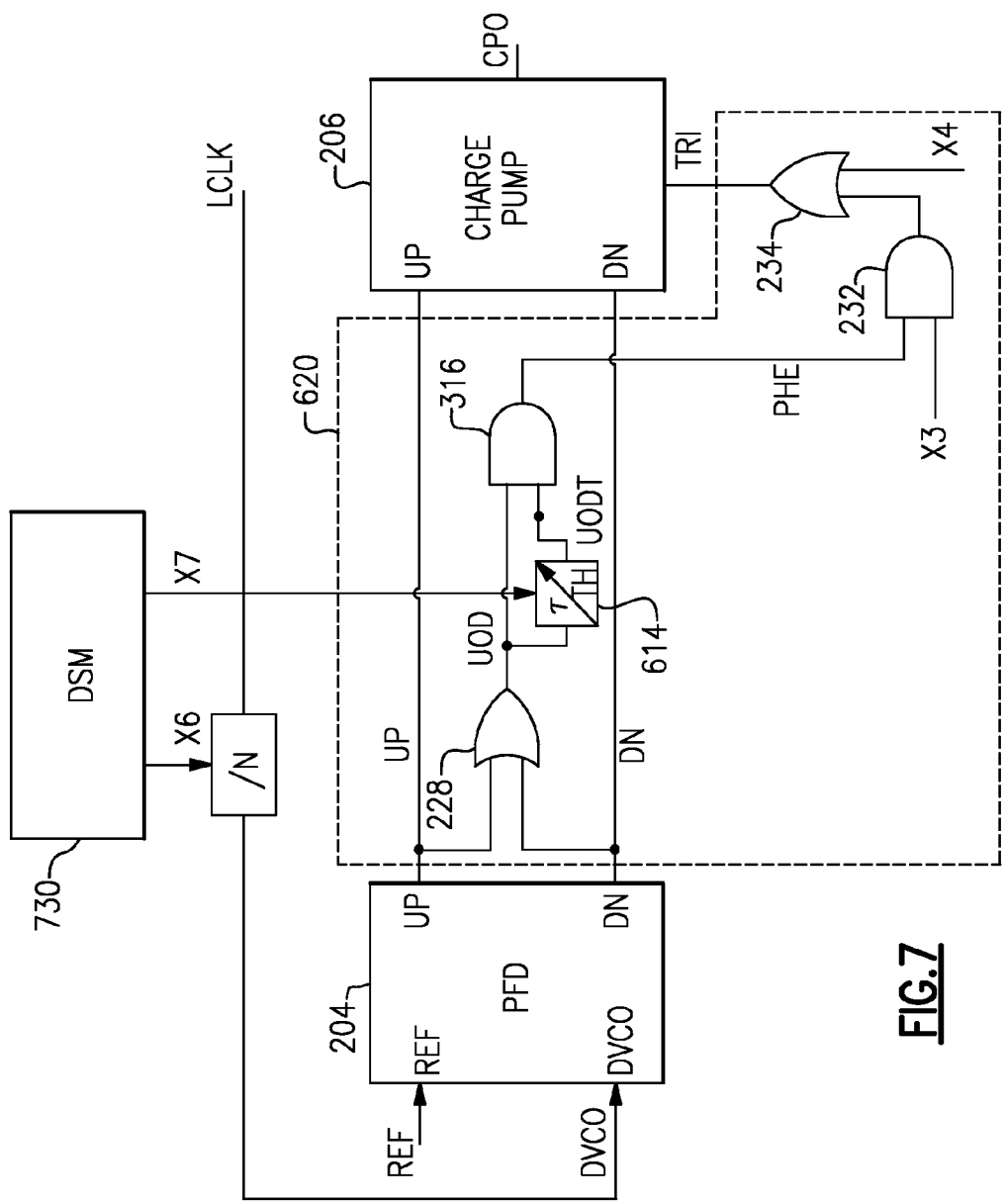
FIG. 7 is a schematic diagram showing the connections of a fast detect circuit and a DSM (delta sigma modulator) feed-forward correction circuit in a PLL according to one embodiment.

FIG. 7 is a schematic diagram showing the connections of a fast detect circuit 720 and a DSM (delta sigma modulator) feed-forward correction circuit 730 in a PLL according to one embodiment. The fast detect circuit 720 of FIG. 7 can be similar to the embodiment of FIG. 3 except the first delay block 314 is replaced by a variable delay block 714 and the divider circuit 218 is replaced with a programmable divider circuit 718. Under delta-sigma modulation, the phase-error at the PFD can hop around in relatively large steps, which could inadvertently trigger the tri-state or holdover condition. The amount of phase-error that the DSM modulation introduces in any given cycle is a well-known quantity, and so the variable delay block 714 can be controlled by the DSM feed-forward correction circuit 730 to have the threshold time delay $\tau_{th}$ dynamically adjusted by a DSM delay control signal X7. Additionally, the programmable divider circuit 718 can be controlled by the DSM feed-forward correction circuit 730 to divide the output clock signal by a programmable divisor N based upon a divisor control signal X6. The combination of the DSM feed-forward correction circuit 730 with the variable delay block 714 and the programmable divider circuit 718, thereby offers additional degrees of freedom.

FIG. 8 is a schematic diagram of a PLL 800 having a fast detect circuit 820 according to an alternative embodiment. Unlike the PLL 200 of FIG. 2, the PLL 800 of FIG. 8 uses an exclusive-or (XOR) gate 804 to compare the reference signal REF with the divided output clock signal DVCO. The XOR gate 804 performs the logical exclusive-or XOR operation of the reference signal REF with the divided output clock signal DVCO and provides the phase error signal VXO at an output node of the XOR gate 804. The loop filter 208 of FIG. 2 is replaced with a low pass filter 808 having a low pass resistor R2 814 and a low pass capacitor C3 816 connected so as to filter a filter input signal VXS at an input node of the low pass filter 808 and to provide a filter output signal VXF at an output node of the 2 low pass filter 808. In this configuration the filter output signal VXF provides the tuning port voltage for the voltage controlled oscillator 216. Also, the embodiment of FIG. 8 does not use the charge pump 206. Instead, a filter switch 812 is electrically connected between the output node of the XOR gate 804 and the input node of the low pass filter 808.

The fast detect circuit 820 of FIG. 8 differs from the fast detect circuit 220 of FIG. 2 in the circuit elements used to generate the logic comparator output signal PHE. Instead of using time delay circuit blocks, the fast detect circuit 820 uses comparators to compare voltages of the PLL 800. In contrast to the fast detect circuit 220, the fast detect circuit 820 replaces the first OR gate 228 and the logic time detection circuit 230 of the fast detect circuit 220 with the following: a first operational transconductance amplifier OTA 850, a second operational transconductance amplifier OTA 854, a first compensation impedance Z4 852, a second compensation impedance Z5 856, a first comparator 858, a second comparator 860, and a third OR gate 866. An inverting input node of the first operational transconductance amplifier OTA 850 and a noninverting input node of the second operational transconductance amplifier OTA 854 are electrically connected to the output node of the XOR gate 804 so as to receive the phase error signal VXO. A noninverting input node of the first operational transconductance amplifier OTA 850 and an inverting input node of the second operational transconductance amplifier OTA 854 are electrically connected to the output node of the low pass filter 808 so as to receive the filter output signal VXF. The first compensation impedance Z4 852 is a first parallel resistor and capacitor electrically connected between an output of the first operational transconductance amplifier OTA 850 and ground so as to stabilize a first amplifier voltage VCA. The second compensation impedance Z5 856 is a second parallel resistor and capacitor electrically connected between an output of the second operational transconductance amplifier OTA 854 and ground so as to stabilize a second amplifier voltage VCB. The first comparator 858 compares the first amplifier voltage VCA to a stable voltage VTH and provides a first comparator output logic signal X8 at an output node of the first comparator 858. The second comparator 860 compares the second amplifier voltage VCB to the stable voltage VTH and provides a second comparator output logic signal X9 at an output node of the second comparator 860. Also, the third OR gate 866 provides the logic comparator output signal PHE by performing a logical OR operation of the first comparator output logic signal X8 with the second comparator output logic signal X9.

When the PLL 800 operates in phase lock, the voltages VXO and the filter output signal VXF are approximately equal and the logic comparator output signal PHE remains at a logic low.

However, when the PLL 800 experiences a relatively large phase error, the voltage VXO will transition so that either the first amplifier voltage VCA or the second amplifier voltage VCB changes with respect to the stable voltage VTH. This in turn can cause either the first comparator 858 or the second comparator 860 to change logic states. In this way either the first comparator output logic signal X8 or the second comparator output logic signal X9 transitions so as to cause the logic comparator output signal PHE to change state to a logic high.

In another alternative embodiment, rather than use an OR gate for the first OR gate 228 (FIG. 3), an XOR gate can be substituted such that the output of the XOR gate senses when only one of the pump up signal UP or pump down signal DN is logic high, which should correspond to the phase error. The amount of the delay of the first delay block 314 can be adjusted from the description given in connection with FIG. 3 and can correspond to a time corresponding to a phase error amount at which it is desired to place the PLL 200 into holdover. Other alternative circuits will be readily determined by one of ordinary skill in the art.

One embodiment includes an apparatus, wherein the apparatus includes a detector circuit 228/230, 804/820 configured to determine whether or not a phase error greater than a predetermined threshold amount exists based on outputs of a phase detector 204 of a phase-locked loop PLL, and a holdover circuit 234/820 configured to initiate a holdover state in which a control voltage for a voltage-controlled oscillator (VCO) of the PLL is maintained steady, wherein the holdover state is initiated when the detector circuit has determined that the phase error greater than the predetermined threshold amount exists.

In one embodiment, the detector circuit 228/230 can be configured to determine whether or not the phase error greater than the predetermined threshold amount exists within one cycle of a reference clock signal.

Certain embodiments can further includes a controller 222 configured to receive a logic comparator output signal PHE from the holdover circuit 234 and to set forcing signal X4 based on a state of the logic comparator output signal PHE, wherein the forcing signal X4 maintains the holdover state. Certain embodiments can further include a multiplexer 202, wherein a plurality of reference clock signals are provided as inputs to the multiplexer, wherein the output of the multiplexer is provided as a reference clock signal for the PLL, wherein the controller 222 is configured to select a different input of the multiplexer for the output of the multiplexer and to exit from the holdover state.

In one embodiment, the detector circuit further includes: an OR gate 228 or an XOR gate having a first input, a second input, and an output, wherein the first input is coupled to a first output UP of a phase frequency detector 204, wherein the second input is coupled to a second output DOWN of the phase frequency detector; a delay circuit 314 having an input and an output, wherein the input of the delay circuit is operatively coupled to the output of the OR gate 228; and an AND gate 316 having a first input, a second input, and an output, wherein the first input is operatively coupled to the output of the OR gate, wherein the second input is operatively coupled to the output of the delay circuit, wherein the output of the AND gate is configured to initiate the holdover state.

In one embodiment, the phase detector includes an XOR gate 804 having inputs configured to receive reference clock signals and an output, further comprising a switch 312 disposed in a signal path between the XOR gate and the VCO of the PLL, wherein the holdover circuit 222/234 is configured to control the switch 312 such that the switch 312 is open circuit in the holdover state.

Applications

Devices employing the above described clock generation circuits can be implemented into various electronic devices. Examples of the electronic devices can include, but are not limited to, consumer electronic products, parts of the consumer electronic products, electronic test equipment, etc. Examples of the electronic devices can also include circuits of optical networks or other communication networks. The consumer electronic products can include, but are not limited to, an automobile, a camcorder, a camera, a digital camera, a portable memory chip, a washer, a dryer, a washer/dryer, a copier, a facsimile machine, a scanner, a multifunctional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:
    a detector circuit configured to determine whether or not an atypical amount of phase error exists in a phase-locked loop (PLL) or a delay-locked loop (DLL); and
    a holdover circuit configured to enter a holdover state in which a frequency/delay control signal is maintained steady, wherein the holdover state is initiated asynchronously when the detector circuit has determined that the atypical amount of phase error exists.

2. The apparatus of claim 1, further comprising a controller configured to selectively enable and/or bypass the detector and maintain the holdover state based on a known state of the system.

3. The apparatus of claim 2, further comprising a multiplexer, wherein a plurality of reference clock signals are provided as inputs to the multiplexer, wherein the output of the multiplexer is provided as a reference clock signal for the PLL or DLL, wherein the controller is configured to select a different input of the multiplexer for the output of the multiplexer and to exit from the holdover state.

4. The apparatus of claim 1, further comprising a switch disposed in a signal path between charge pumps and the VCO of the PLL or delay lines of the DLL, wherein the holdover circuit is configured to control the switch such that the switch is open circuit in the holdover state.

5. The apparatus of claim 1, wherein the detector circuit further comprises:
    an OR gate having a first input, a second input, and an output, wherein the first input is coupled to a first output of a phase frequency detector, wherein the second input is coupled to a second output of the phase frequency detector;
    a delay circuit having an input and an output, wherein the input of the delay circuit is operatively coupled to the output of the OR gate; and
    an AND gate having a first input, a second input, and an output, wherein the first input is operatively coupled to the output of the OR gate, wherein the second input is operatively coupled to the output of the delay circuit, wherein the output of the AND gate is configured to initiate the holdover state.

6. The apparatus of claim 5, wherein a delay of the delay circuit is greater than a minimum reset pulse width of the phase frequency detector.

7. The apparatus of claim 5, wherein the delay of the delay circuit is configurable.

8. The apparatus of claim 1, wherein the phase detector comprises an XOR gate having inputs configured to receive reference clock signals and an output, further comprising a switch disposed in a signal path between the XOR gate and the VCO of the PLL or delay lines of the DLL, wherein the holdover circuit is configured to control the switch such that the switch is open circuit in the holdover state.

9. The apparatus of claim 1, wherein the detector circuit further comprises:
    an exclusive-OR (XOR) gate having a first input, a second input, and an output, wherein the first input is coupled to a first output of a phase frequency detector, wherein the second input is coupled to a second output of the phase frequency detector;
    a delay circuit having an input and an output, wherein the input of the delay circuit is operatively coupled to the output of the XOR gate; and
    an AND gate having a first input, a second input, and an output, wherein the first input is operatively coupled to the output of the XOR gate, wherein the second input is operatively coupled to the output of the delay circuit, wherein the output of the AND gate is configured to initiate the holdover state.

10. A method of initiating a holdover state comprising:
    determining whether or not an atypical amount of phase error exists in a phase-locked loop or a delay-locked loop; and
    entering a holdover state in which a frequency/delay control signal is maintained steady, wherein the holdover state is asynchronously initiated when the existence of the atypical amount of phase error has been detected.

11. The method of claim 10, further comprising maintaining the holdover state based on a known state of the system.

12. The method of claim 11, further comprising providing a plurality of reference clock signals as inputs to a multiplexer, wherein the output of the multiplexer is provided as a reference clock signal for the PLL or DLL, further comprising selecting a different input of the multiplexer for the output of the multiplexer and exiting from the holdover state.

13. The method of claim 10, further comprising controlling a switch disposed in a signal path between charge pumps and the VCO of the PLL or delay lines of the DLL, wherein the switch is controlled such that the switch is open circuit in the holdover state.

14. The method of claim 10, further comprising:
    ORing a first output of a phase frequency detector with a second output of the phase frequency detector to generate a trigger pulse signal;
    delaying the trigger pulse signal to generate a delayed pulse signal; and
    initiating the holdover state based on an ANDing of the trigger pulse signal and the delayed pulse signal.

15. The method of claim 14, wherein the delayed pulse signal is delayed from the trigger pulse signal by an amount greater than a minimum reset pulse width of a phase frequency detector.

16. The method of claim 14, further comprising adjusting the amount of delay between the delayed pulse signal and the trigger pulse signal.

17. The method of claim 10, wherein determining whether or not the atypical amount of phase error exists further comprising exclusive ORing reference clock signals with an XOR gate, further open circuiting a switch disposed in a signal path between the XOR gate and the VCO of the PLL or delay lines of the DLL in the holdover state.

18. The method of claim 10, further comprising:
exclusive ORing a first output of a phase frequency detector with a second output of the phase frequency detector to generate a trigger pulse signal;
delaying the trigger pulse signal to generate a delayed pulse signal; and
initiating the holdover state based on an ANDing of the trigger pulse signal and the delayed pulse signal.

19. An apparatus comprising:
a means for determining whether or not an atypical amount of phase error exists in a phase-locked loop or a delay-locked loop; and
a means for entering a holdover state in which a frequency/delay control signal is maintained steady, wherein the holdover state is asynchronously initiated when the existence of the atypical amount of phase error has been detected.

20. The apparatus of claim 1, wherein the detector circuit further comprises:
an OR or XOR gate having a first input, a second input, and an output, wherein the first input is coupled to a first output of a phase frequency detector, wherein the second input is coupled to a second output of the phase frequency detector; and
a logic time detection circuit configured to compare a timing characteristic of the output relative to a threshold time delay and generate a logic comparator output signal configured to initiate the holdover state, wherein the threshold time delay is configurable.

21. The method of claim 10 further comprising:
ORing or XORing a first output of a phase frequency detector with a second output of the phase frequency detector to generate a trigger pulse signal; and
comparing a timing characteristic of the trigger pulse signal to a threshold time delay to generate a logic comparator output signal configured to initiate the holdover state, wherein the threshold time delay is configurable.

* * * * *